(12) United States Patent
Park et al.

(10) Patent No.: US 12,154,810 B2
(45) Date of Patent: Nov. 26, 2024

(54) AUTOMATED SEMICONDUCTOR SUBSTRATE POLISHING AND CLEANING

(71) Applicant: GlobalWafers Co., Ltd., Hsinchu (TW)

(72) Inventors: ShinBae Park, Cheonan-Si (KR); SangJun Kim, Cheonan-Si (KR)

(73) Assignee: GlobalWafers Co., Ltd., Hsinchu (TW)

( * ) Notice: Subject to any disclaimer, the term of this patent is extended or adjusted under 35 U.S.C. 154(b) by 906 days.

(21) Appl. No.: 16/947,157

(22) Filed: Jul. 21, 2020

(65) Prior Publication Data

US 2022/0028718 A1    Jan. 27, 2022

(51) Int. Cl.
| | |
|---|---|
| *H01L 21/677* | (2006.01) |
| *B08B 3/04* | (2006.01) |
| *B08B 13/00* | (2006.01) |
| *B24B 37/04* | (2012.01) |
| *B24B 37/08* | (2012.01) |
| *B25J 15/06* | (2006.01) |
| *B65G 47/91* | (2006.01) |
| *H01L 21/02* | (2006.01) |
| *H01L 21/67* | (2006.01) |
| *H01L 21/687* | (2006.01) |

(52) U.S. Cl.
CPC ......... *H01L 21/67766* (2013.01); *B08B 3/04* (2013.01); *B08B 13/00* (2013.01); *B24B 37/042* (2013.01); *B25J 15/0616* (2013.01); *B65G 47/91* (2013.01); *H01L 21/02024* (2013.01); *H01L 21/02052* (2013.01); *H01L 21/67057* (2013.01); *H01L 21/67219* (2013.01); *H01L 21/67778* (2013.01); *H01L 21/68707* (2013.01); *B24B 37/08* (2013.01)

(58) Field of Classification Search
CPC ......... H01L 21/67766; H01L 21/02024; H01L 21/02052; H01L 21/67057; H01L 21/67219; H01L 21/67778; H01L 21/68707; B08B 3/04; B08B 13/00; B65G 47/91; B24B 37/005; B24B 37/042345
See application file for complete search history.

(56) References Cited

U.S. PATENT DOCUMENTS

| | | |
|---|---|---|
| 5,275,184 A | 1/1994 | Nishizawa et al. |
| 5,804,507 A | 9/1998 | Perlov et al. |
| 5,893,795 A * | 4/1999 | Perlov ...................... B23Q 7/00 312/273 |
| 6,368,040 B1 * | 4/2002 | Yamasaki ......... H01L 21/67781 414/404 |

(Continued)

FOREIGN PATENT DOCUMENTS

| | | |
|---|---|---|
| CN | 107346753 A | 11/2017 |
| WO | 2007079978 A1 | 7/2007 |

OTHER PUBLICATIONS

International Search Report and Written Opinion issued in Application No. PCT/US2021/042340 mailed on Nov. 2, 2021; pp. 1-15.

*Primary Examiner* — Robert F Neibaur
(74) *Attorney, Agent, or Firm* — Armstrong Teasdale LLP

(57) ABSTRACT

A semiconductor wafer processing system for processing a set of semiconductor wafers includes a controller, a transfer robot controlled by the controller, a wet bath for containing a cleaning solution, and a cassette positioned in the wet bath for holding the set of wafers. The transfer robot transfers the wafer from a transfer location to the cassette and the controller controls the transfer robot during the transfer.

14 Claims, 16 Drawing Sheets

(56) References Cited

U.S. PATENT DOCUMENTS

| | | | |
|---|---|---|---|
| 7,249,992 B2* | 7/2007 | Kalenian | H01L 21/68785 |
| | | | 451/5 |
| 8,079,894 B2 | 12/2011 | Tolles et al. | |
| 11,742,226 B2* | 8/2023 | Otsu | H01L 21/67757 |
| | | | 137/561 A |
| 2006/0241813 A1* | 10/2006 | Babu | H01L 21/67173 |
| | | | 700/255 |
| 2015/0270147 A1* | 9/2015 | Kobayashi | H01L 21/68721 |
| | | | 134/76 |
| 2016/0332301 A1* | 11/2016 | Kesil | B25J 11/0095 |
| 2019/0273003 A1 | 9/2019 | Wang et al. | |

\* cited by examiner

AUTOMATED SEMICONDUCTOR SUBSTRATE POLISHING AND CLEANING

FIELD

The field of the disclosure relates to processing semiconductor substrates and, in particular, methods and systems for automated semiconductor wafer polishing and cleaning.

BACKGROUND

Semiconductor wafers are commonly used in the production of integrated circuit (IC) chips on which circuitry are printed. The circuitry is first printed in miniaturized form onto surfaces of the wafers. The wafers are then broken into circuit chips. This miniaturized circuitry requires that front and back surfaces of each wafer be extremely flat and substantially free of defects to ensure that the circuitry can be properly printed over the entire surface of the wafer. To accomplish this, polishing processes are commonly used to improve flatness of the front and back surfaces of the wafer after the wafer is cut from an ingot. A particularly good, defect free finish is required when polishing the wafer in preparation for printing the miniaturized circuits on the wafer by an electron beam-lithographic or photolithographic process (hereinafter "lithography").

Once the wafer has been polished, the wafer is cleaned in a wet bath to remove any debris generated during polishing. Typically, the wafer is transferred from the polisher to the wet bath manually using vacuum pencils to hold the wafers during transfer. That is, an operator typically picks up the wafer with the vacuum pencil and places the wafer in the wet bath. Automating the transfer process would increase the efficiency of the wafer manufacturing process and decrease production costs. However, the robots that typically transfer wafers in manufacturing facilities and the wet baths that typically clean the wafers are not designed for the precision handling required to safely place the wafers in the wet bath without scratching or otherwise damaging the wafers during the transfer process.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a semiconductor wafer processing system for processing a set of semiconductor wafers. The system includes a controller, a transfer robot controlled by the controller, a wet bath for containing a cleaning solution, and a cassette positioned in the wet bath for holding the set of wafers. The transfer robot transfers the wafer from a transfer location to the cassette and the controller controls the transfer robot during the transfer.

Another aspect of the present disclosure is directed to a wafer processing system for processing a wafer. The system includes a transfer robot, a wet bath, a cassette, an automated guided vehicle (AGV), and a cassette holder. The wet bath includes a wall and defines a container for retaining a cleaning solution. The cassette is positioned within the wet bath for holding the wafer. The transfer robot transfers the wafer from a transfer location to the cassette. The AGV includes a robot arm for positioning the cassette in the wet bath and removing the cassette from the wet bath. The cassette holder is attached to the wall for maintaining a position of the cassette within the wet bath. The AGV positions the cassette within the cassette holder and removes the cassette from the cassette holder.

Yet another aspect of the present disclosure is directed to a method of processing a wafer. The method includes positioning a cassette within a wet bath with an automated guided vehicle (AGV). The method also includes transferring the wafer from a transfer location to the cassette with a transfer robot. The method further includes removing the cassette and the wafer from the wet bath with the AGV.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

Although specific features of various examples may be shown in some drawings and not in others, this is for convenience only. Any feature of any drawing may be referenced and/or claimed in combination with any feature of any other drawing.

Unless otherwise indicated, the drawings are meant to illustrate features of examples of the disclosure. These features are believed to be applicable in a variety of systems comprising one or more examples of the disclosure. The drawings are not meant to include all conventional features known by those of ordinary skill in the art to be required for the practice of the disclosed examples disclosed.

DETAILED DESCRIPTION

Suitable substrates (which may be referred to as semiconductor or silicon "wafers") include single crystal silicon substrates including substrates obtained by slicing the wafers from ingots formed by the Czochralski process. Each substrate includes a central axis, a front surface, and a back surface parallel to the front surface.

Figure 1:
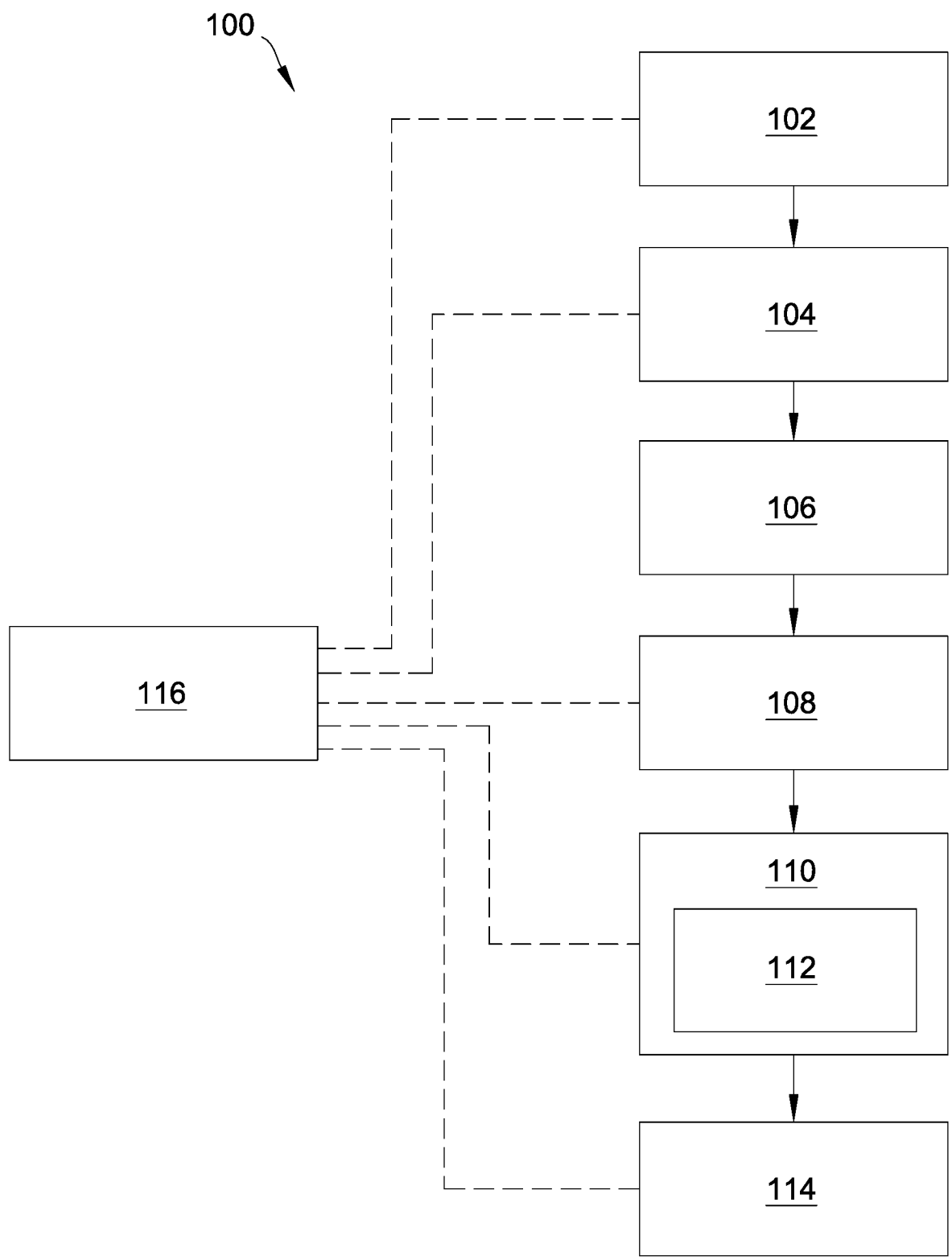
FIG. 1 is a schematic block diagram of a semiconductor wafer processing system.

With reference to FIG. 1, a semiconductor wafer processing system 100 includes a polisher 102, an unloading robot 104, a transfer location 106, a transfer robot 108, a wet bath 110 including a cassette 112, an automated guided vehicle (AGV) 114, and a controller 116. The polisher 102 polishes a wafer 118, the unloading robot 104 unloads the wafer from the polisher to the transfer location 106, the transfer robot 108 transfers the wafers from the transfer location to the cassette 112 in the wet bath 110, and the AGV 114 removes the cassette from the wet bath for further processing of the wafers after the wafers have been cleaned in the wet bath. The system 100 automates the unloading, loading, and cleaning processes by using robots 104, 108, and 114 to unload and load the wafers 118 and the controller 116 to control the robots. Accordingly, system 100 increases the efficiency of the overall wafer production process and decreases the overall cost to produce a wafer.

Figure 2:
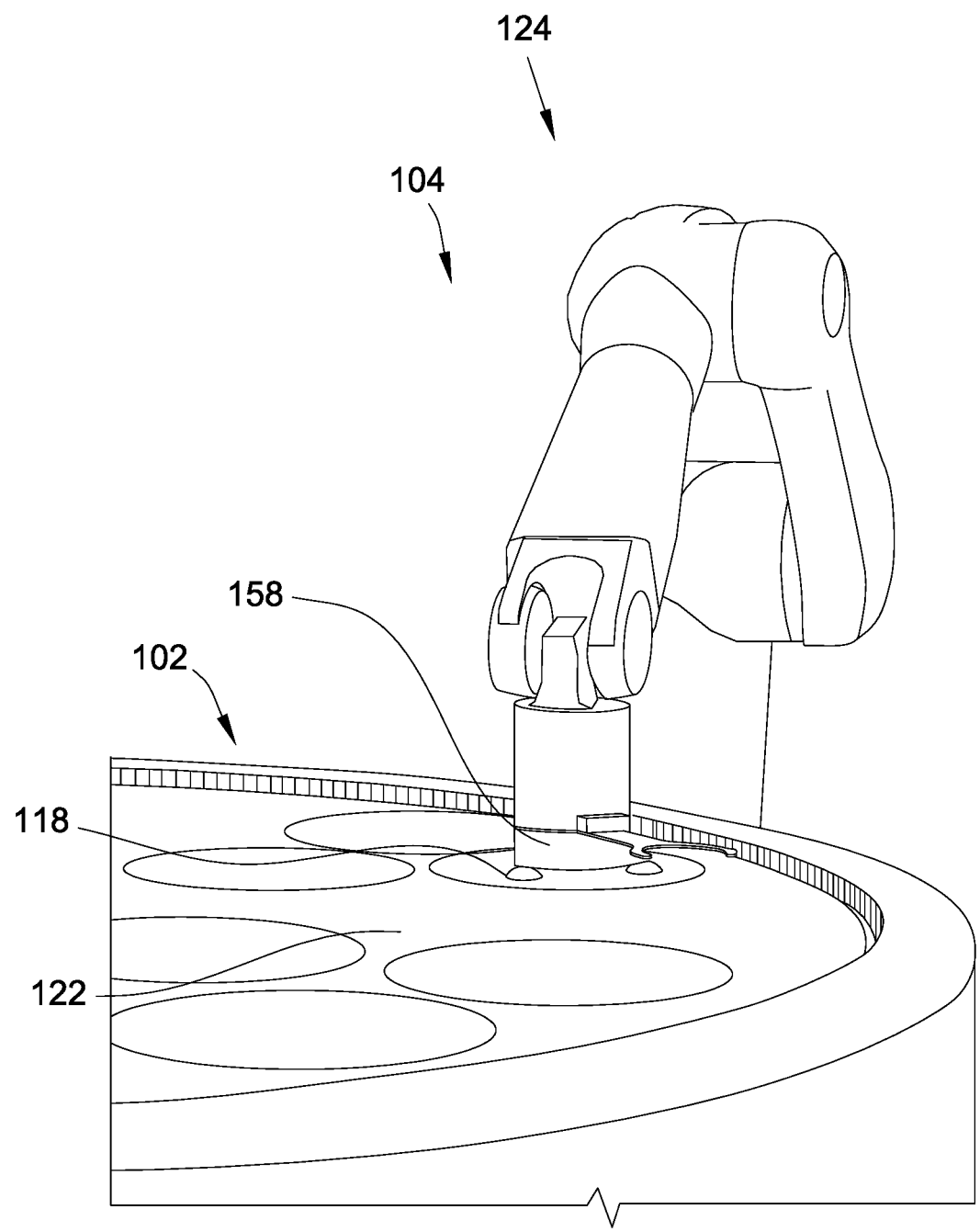
FIG. 2 is a perspective view of a polisher and an unloading robot.
Figure 3:
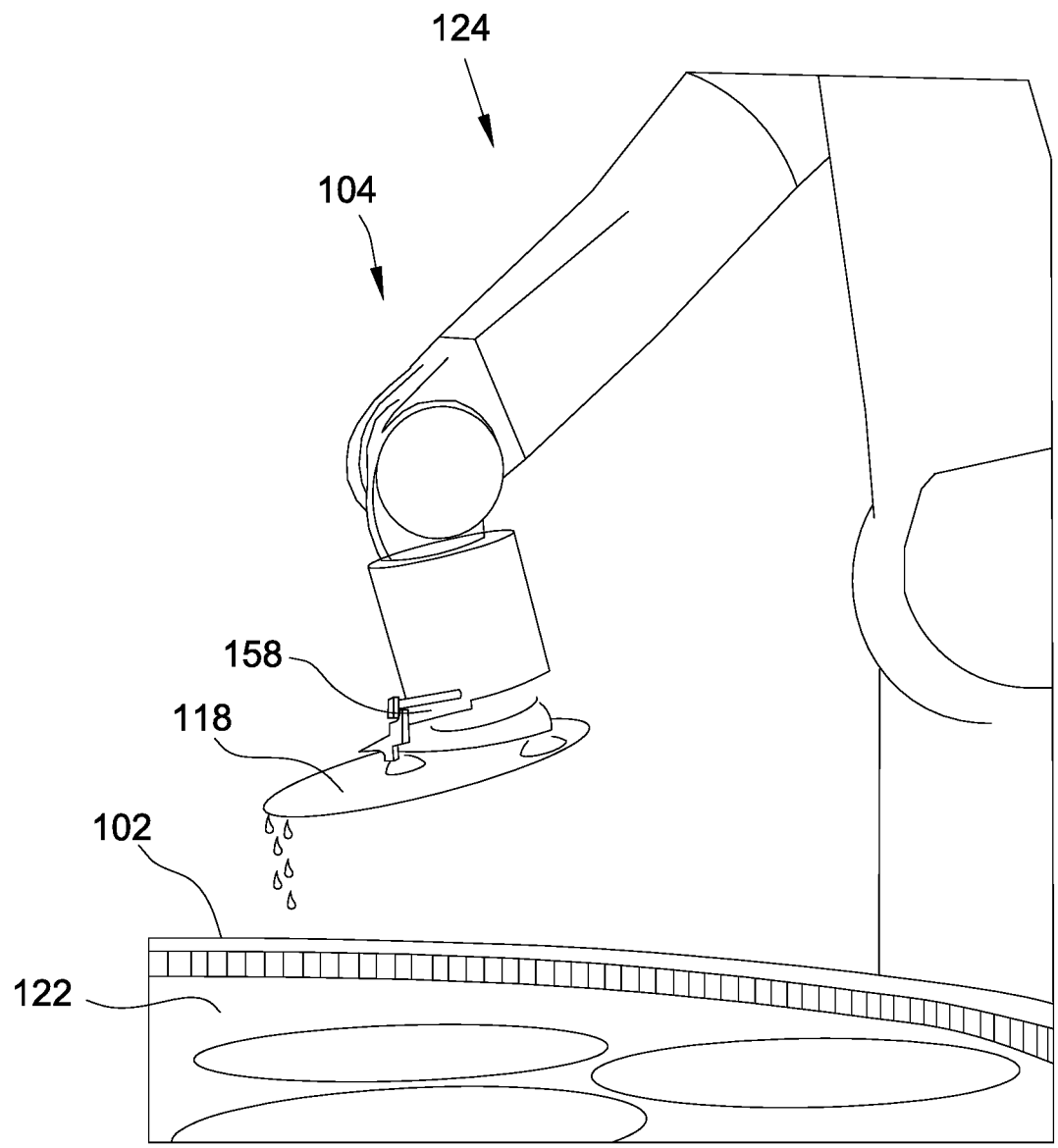
FIG. 3 is another perspective view of the polisher and the unloading robot.

With reference to FIGS. 2 and 3, the polisher 102 is a double-side polisher that rough or finish polishes the wafer 118. The rough and finish polish may be achieved by, for example, chemical-mechanical planarization (CMP). CMP typically involves the immersion of the wafer 118 in an abrasive slurry and polishing the wafer. Through a combination of chemical and mechanical action the surface of the wafer 118 is smoothed. Typically the polish is performed until a chemical and thermal steady state is achieved and until the wafers 118 have achieved their targeted shape and flatness.

The polisher 102 includes a first polishing assembly (not shown) and a second polishing assembly (lower polishing assembly) 122. A first shaft (not shown) is attached to the first polishing assembly, and a second shaft (not shown) is attached to the second polishing assembly 122. The wafer 118 is positioned between the first and second polishing assemblies, and the first and second shafts simultaneously rotate the first and second polishing assemblies, polishing the wafer.

Figure 4:
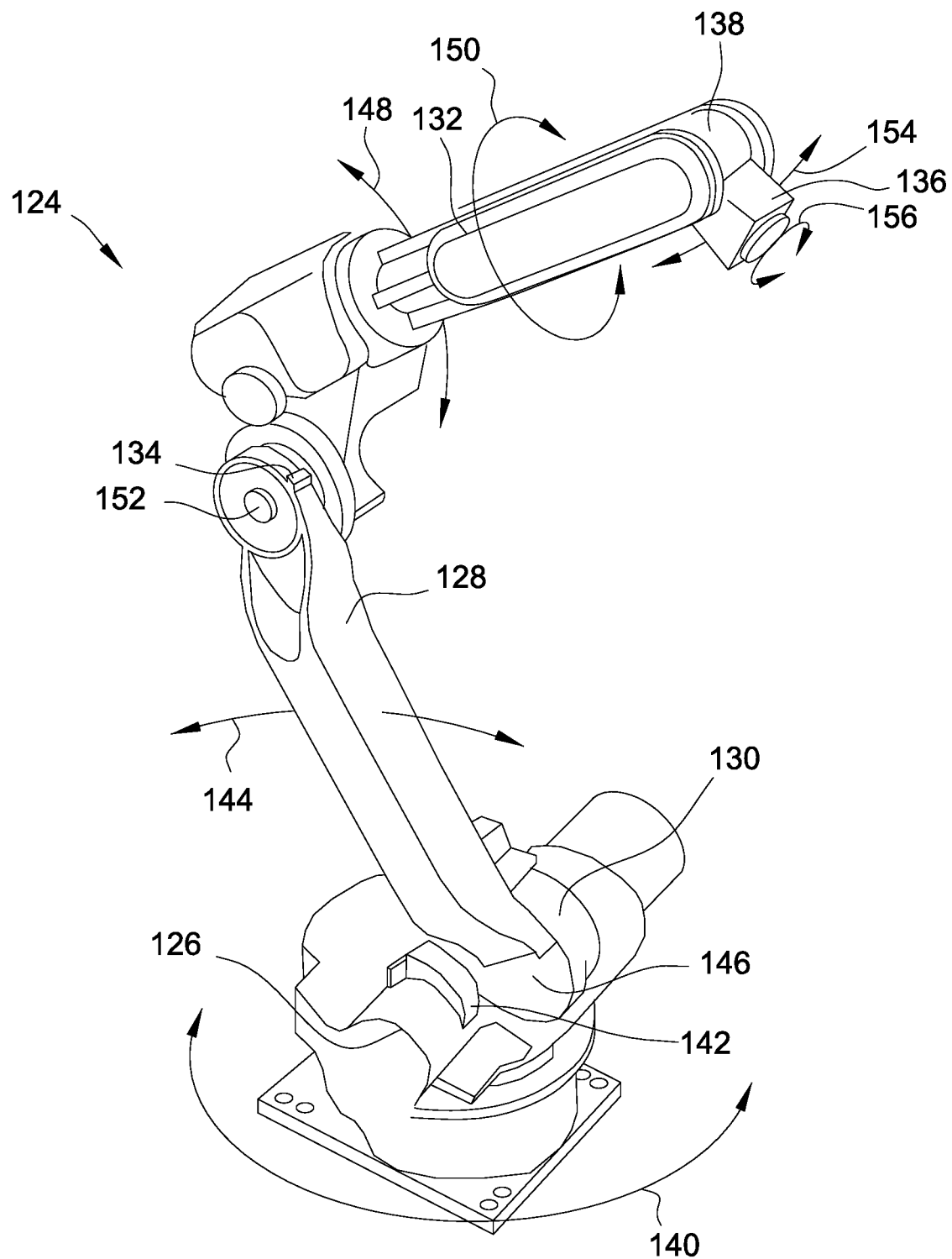
FIG. 4 is a perspective view of a 6-axis robot.

With reference to FIG. 4, the unloading robot 104, transfer robot 108, and AGV 114 each include a 6-axis robot arm 124 including a base 126, a first arm 128, a base-first arm hinge 130, a second arm 132, a first arm-second arm hinge 134, a tip 136, and a second arm-tip hinge 138. The base 126 supports the 6-axis robot arm 124, and the base-first arm hinge 130 movably attaches the base to the first arm 128. The first arm-second arm hinge 134 movably attaches the first arm 128 to the second arm 132, and the second arm-tip hinge 138 movably attaches the second arm 132 to the tip 136.

Specifically, the base 126 rotates the first arm 128, the second arm 132, and the tip 136 about a first axis (generally indicated by arrow 140). The base-first arm hinge 130 pivots the first arm 128 about a first pivot point 142, defining a second axis (generally indicated by arrow 144). The first arm-second arm hinge 134 pivots the second arm 132 about a second pivot point 146, defining a third axis (generally indicated by arrow 148) and rotates the second arm about a fourth axis (generally indicated by arrow 150). The second arm-tip hinge 138 pivots the tip 136 about a third pivot point 152, defining a fifth axis (generally indicated by arrow 154) and rotates the tip about a sixth axis (generally indicated by arrow 156).

Figure 5:
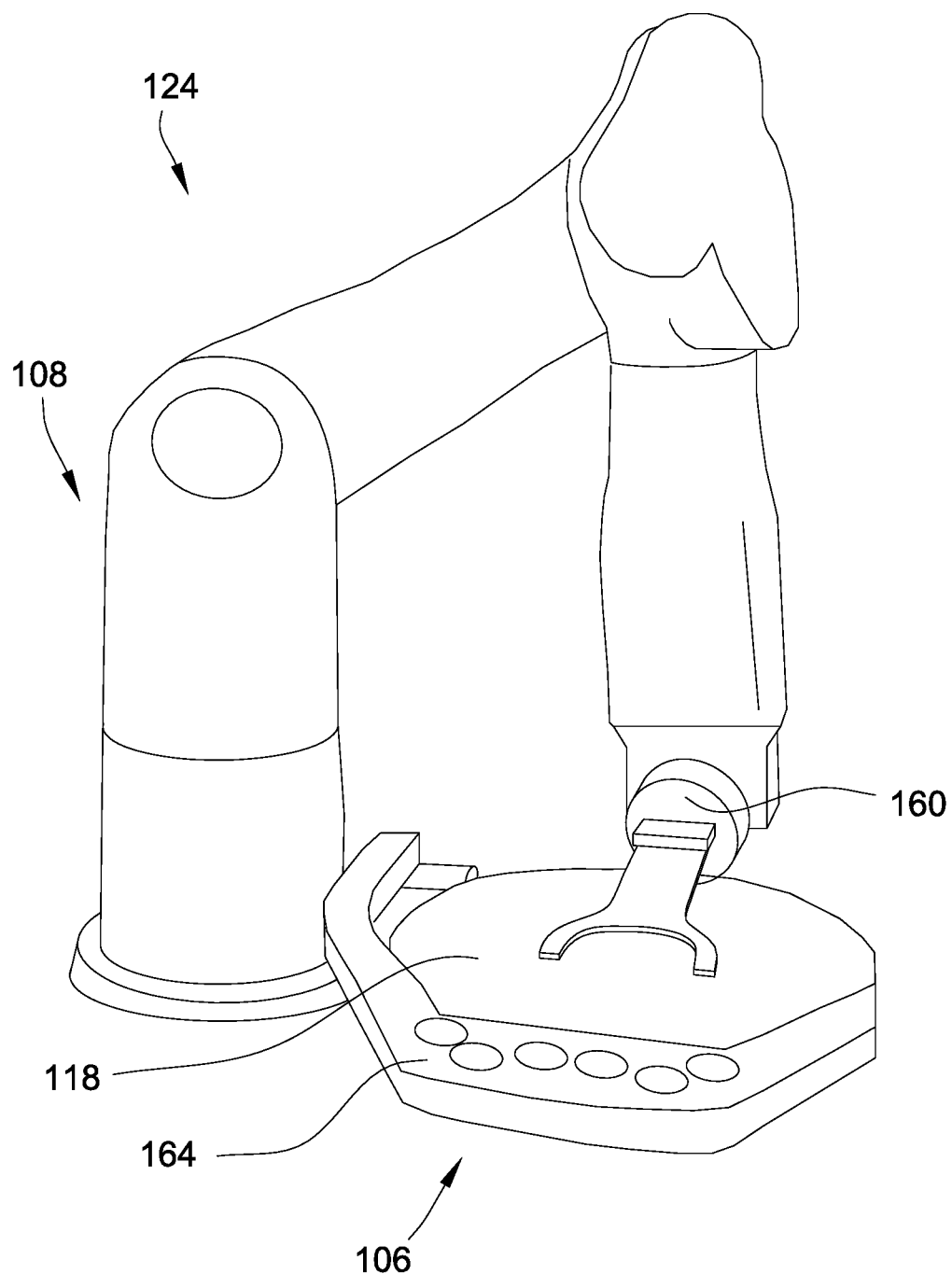
FIG. 5 is a perspective view of a transfer robot and a transfer location.
Figure 6:
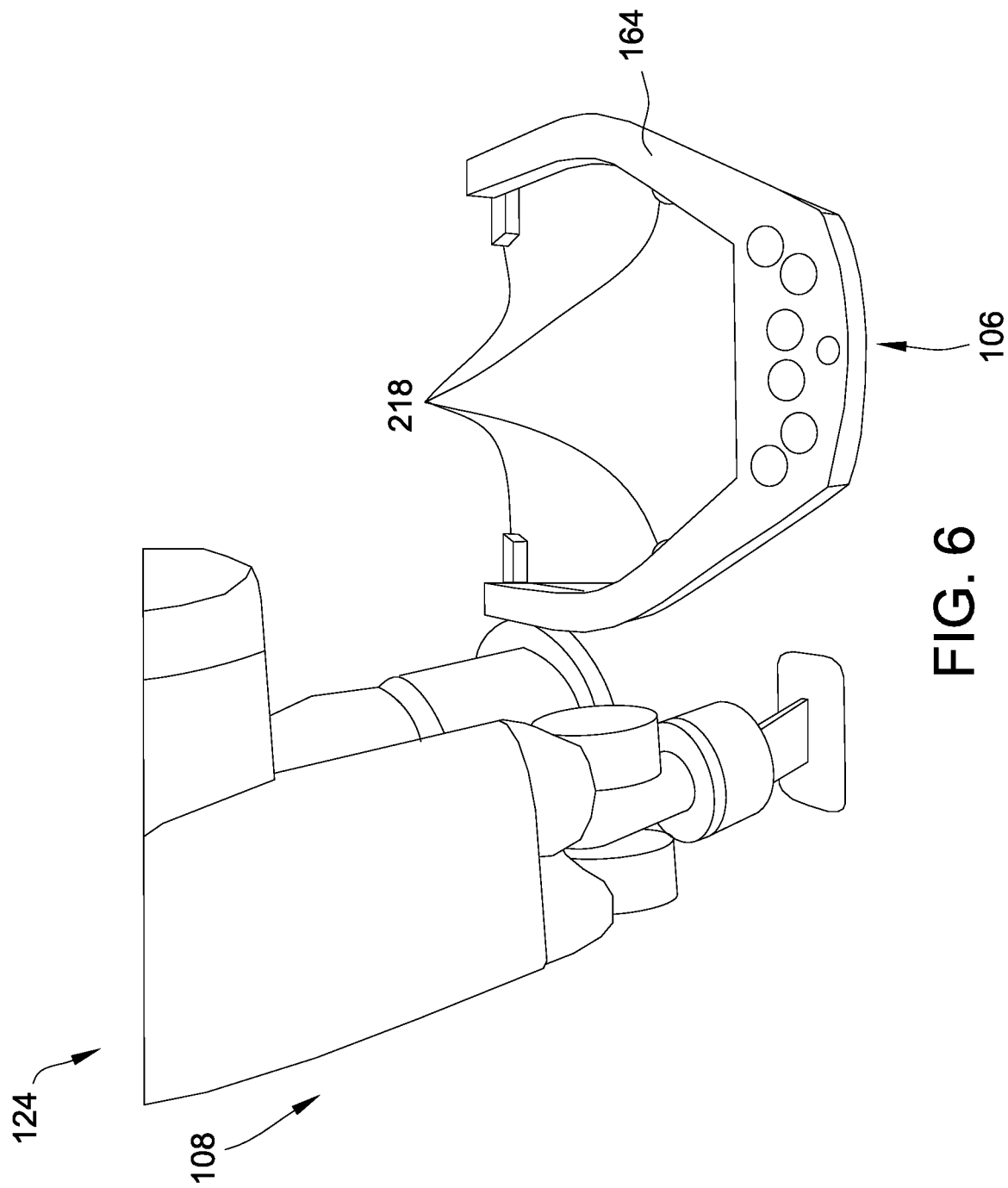
FIG. 6 is a perspective view of a transfer robot and a transfer location.
Figure 7:
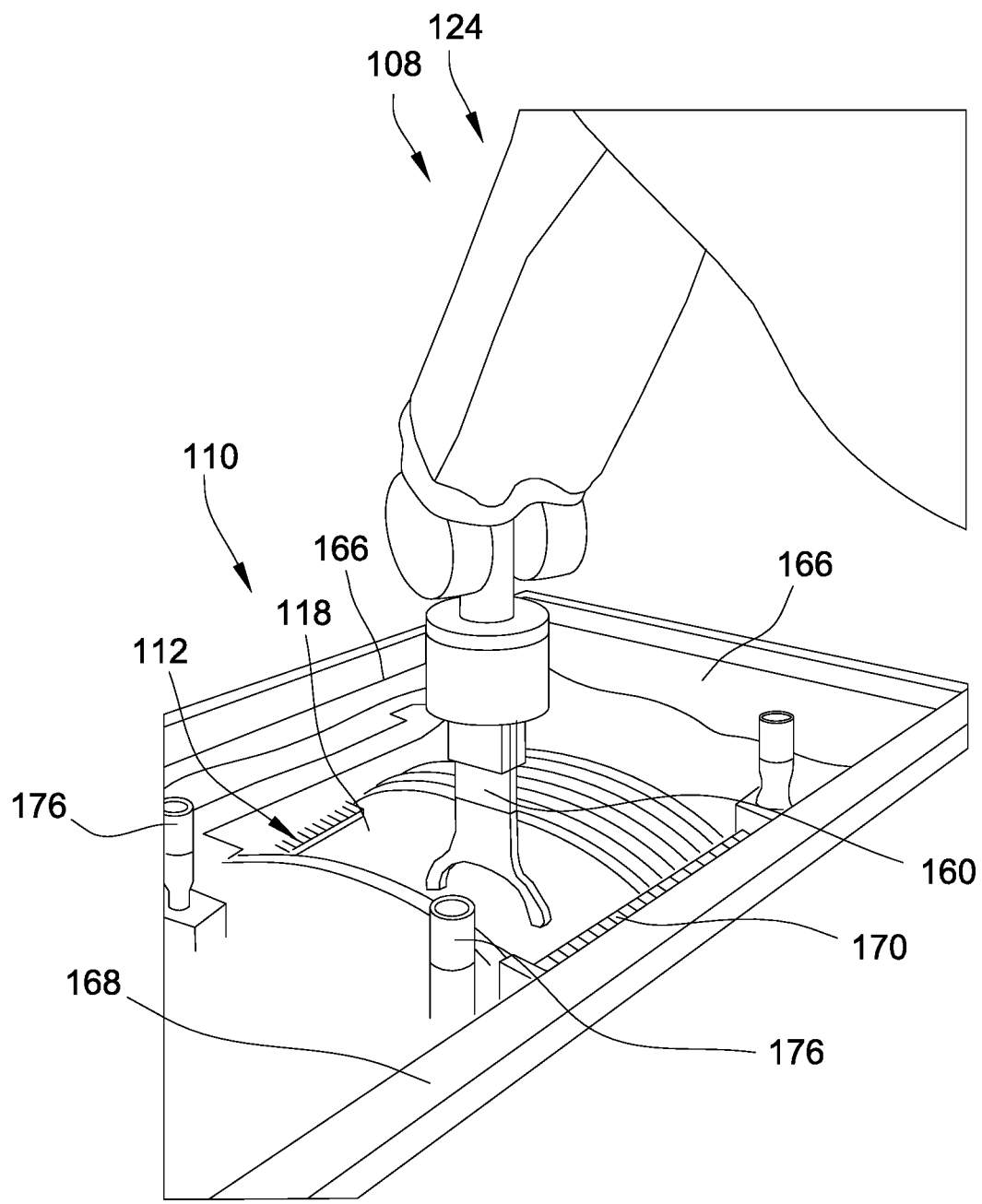
FIG. 7 is a perspective view of the transfer robot and a wet bath.
Figure 15:
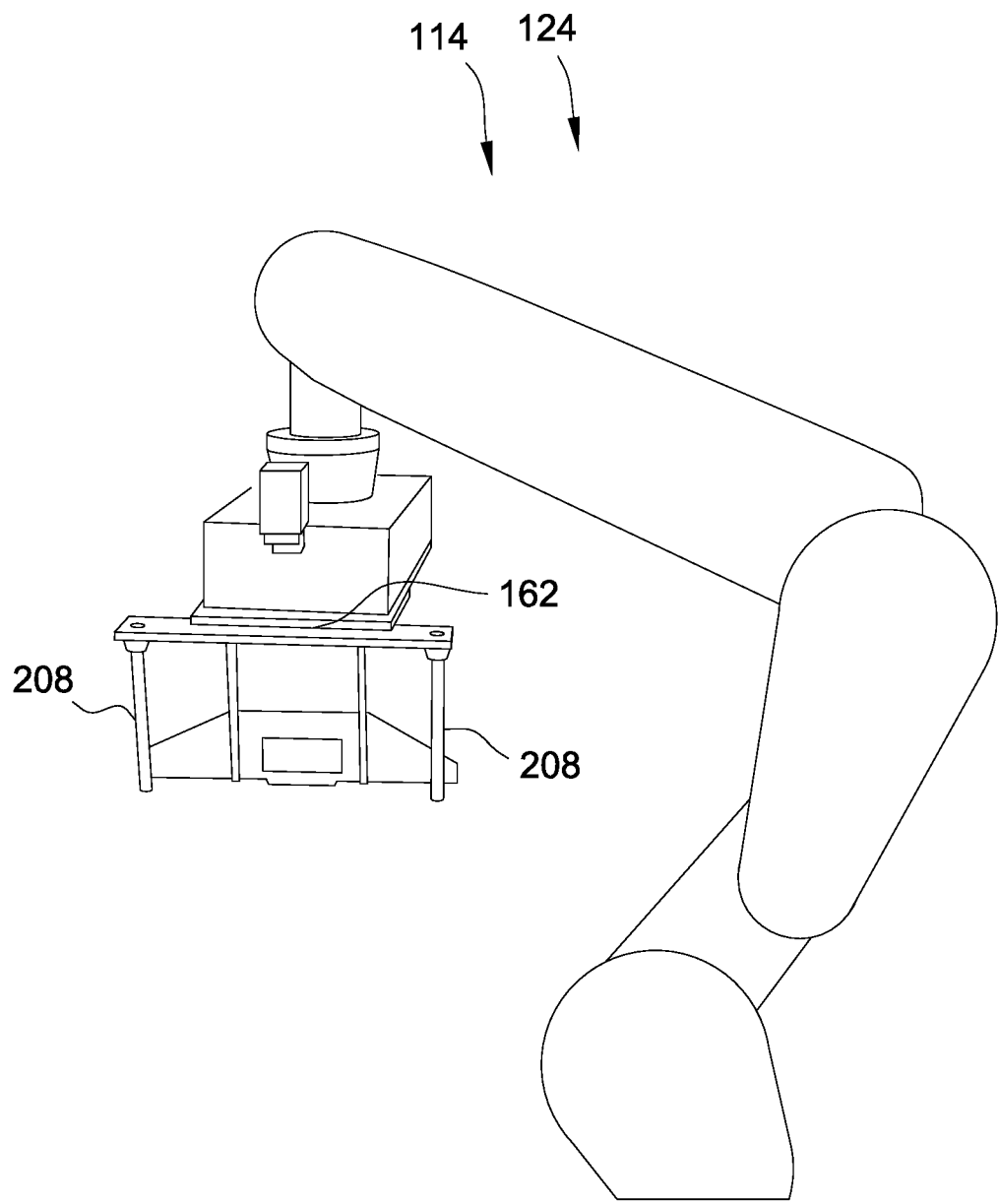
FIG. 15 is a perspective view of the automated guided vehicle positioned next to the wet bath.

With reference to FIGS. 2 and 3, the unloading robot 104 also includes a vacuum attachment 158 attached to the tip 136 for holding the wafer 118 during the transfer between the polisher 102 and the transfer location 106. With reference to FIGS. 5-7, the transfer robot 108 also includes a wafer end effector 160 attached to the tip 136 for holding the wafer 118 during the transfer between the transfer location 106 and the wet bath 110. With reference to FIG. 15, the AGV 114 also includes a cassette transfer attachment 162 attached to the tip 136 for loading and unloading the cassette 112 from the wet bath 110.

With reference to FIGS. 5 and 6, the transfer location 106 includes a wafer holder 164 for temporarily holding the wafer 118 during the transfer between the polisher 102 and the wet bath 110. The wafer holder 164 includes prongs 218 for holding the wafer 118. The wafer holder 164 is suitably made of aluminum, and the prongs 218 are suitably made of polyether ether ketone (PEEK) material. In the illustrated embodiment, the wafer holder 164 includes four prongs 218. However, in alternative embodiments, the wafer holder 164 may include any number of prongs that enable the wafer holder to operate as described.

The wet bath 110 holds the cassette 112 and the wafers 118 and cleans the wafers 118. With reference to FIGS. 7-13, the wet bath 110 includes a plurality of walls 166 that define a container 168 for retaining a cleaning solution. The wet bath 110 also includes at least one cassette holder 170, at least one cassette stage guide 172, a fluid trap 174, and at least one AGV centering guide 176. The cassette stage guide 172 and the AGV centering guide 176 assist the AGV 114 with positioning the cassette 112 in the wet bath 110. The cassette holder 170 retains the cassette 112 in the wet bath 110, the fluid trap 174 retains the cleaning solution in the container 168, and the AGV 114 removes the cassette from the wet bath.

Figure 8:
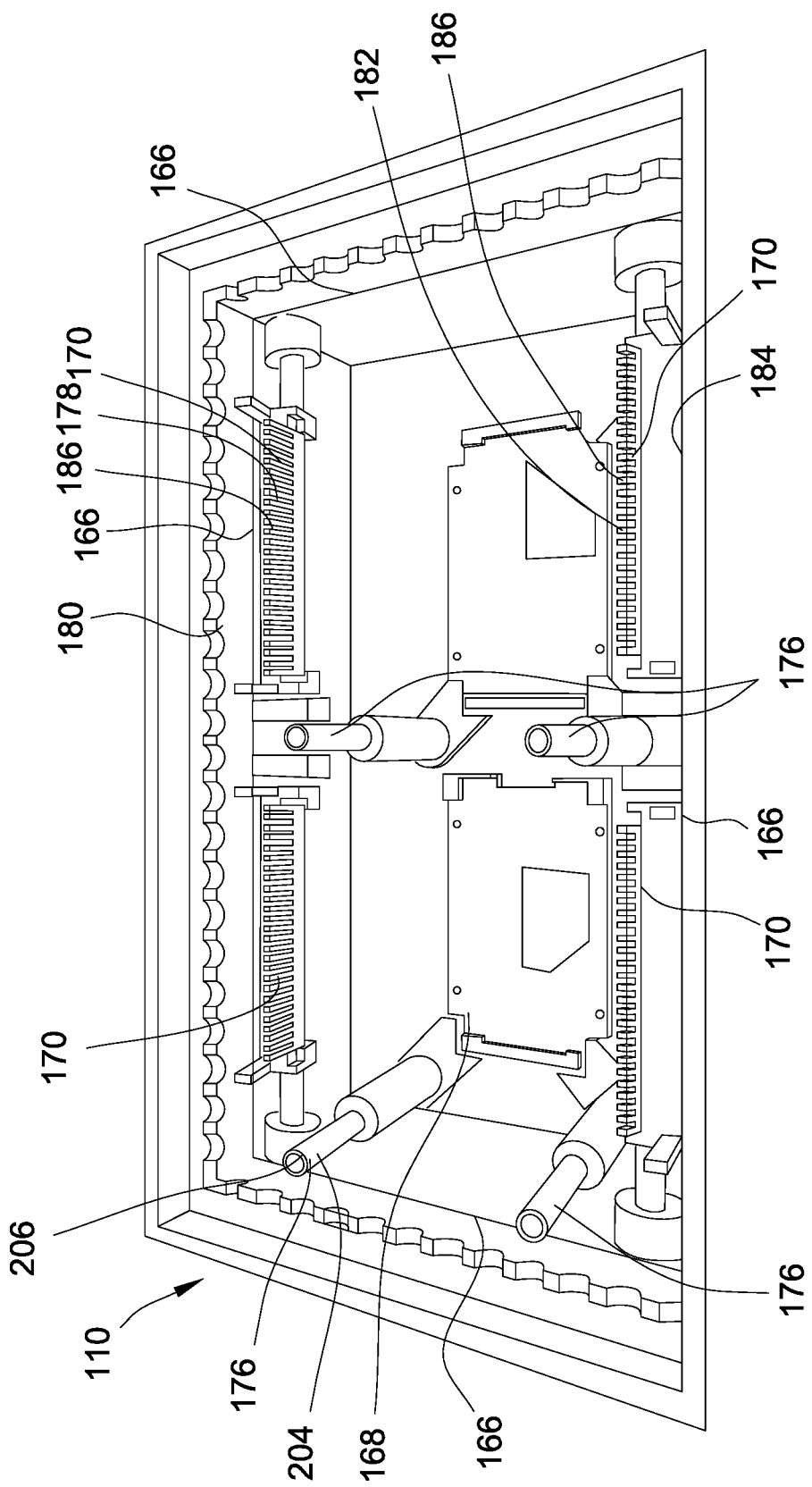
FIG. 8 is a top view of the wet bath.
Figure 9:
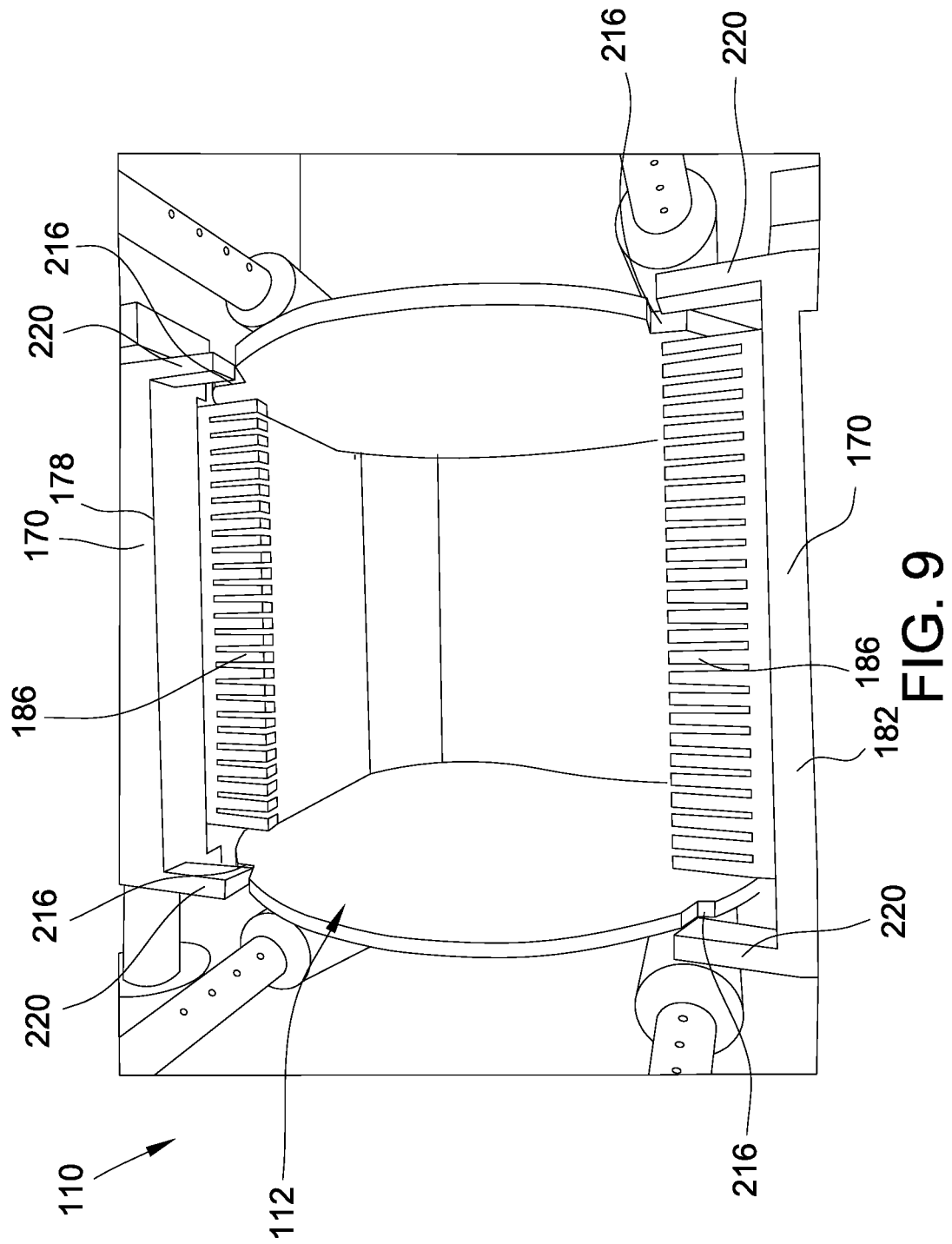
FIG. 9 is a top view of the wet bath and the cassette.
Figure 10:
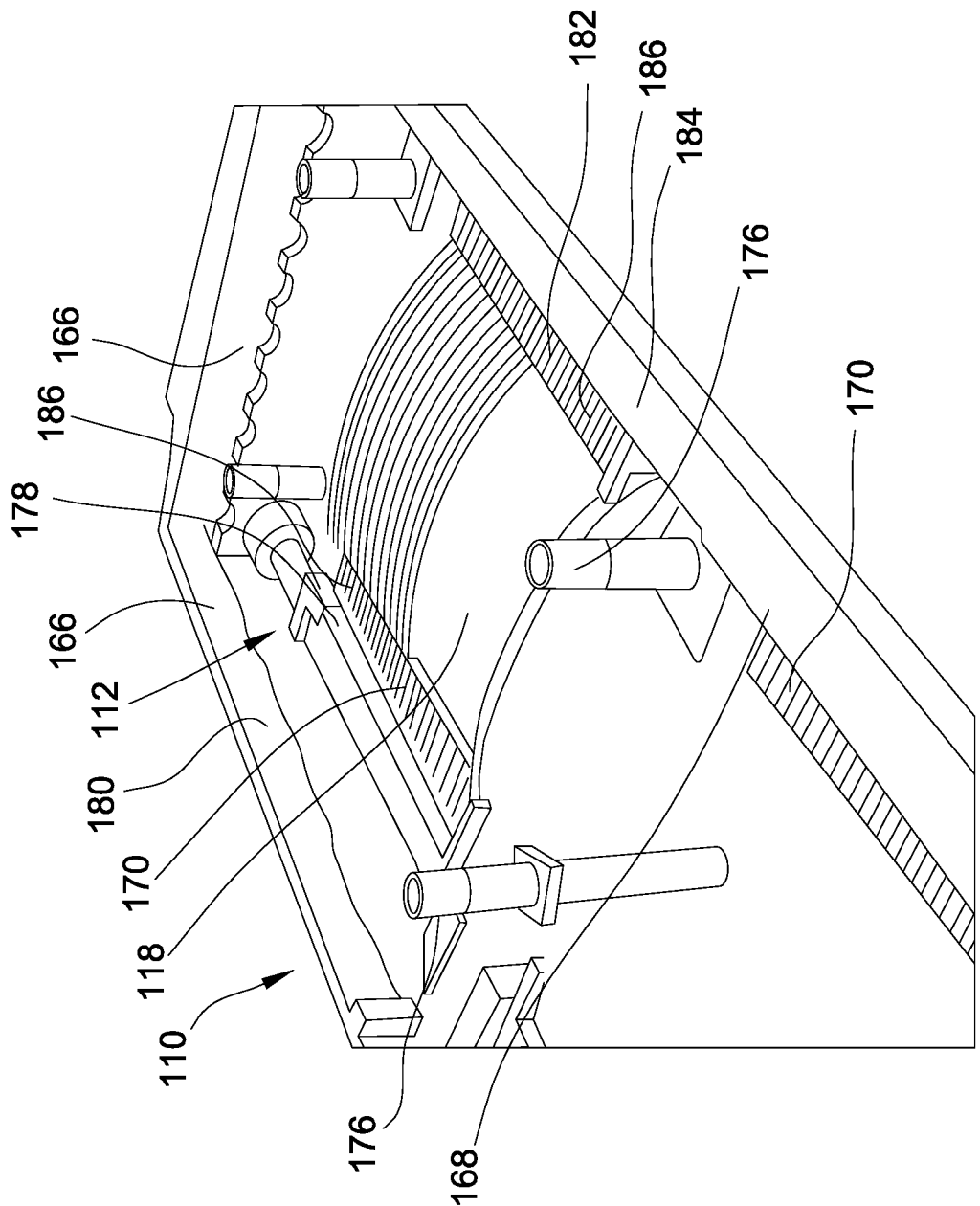
FIG. 10 is a perspective view of the wet bath including a cassette and a plurality of wafers in the cassette and the wet bath.

As illustrated in FIGS. 8-10, the cassette holder 170 is attached to two of the walls 166 of the wet bath 110 and includes a first holder 178 rotatably attached to a first wall 180 and a second holder 182 rotatably attached to a second wall 184 opposite the first wall. The first and second holders 178, 182 each include a cassette latch 220 for engaging and retaining the cassette 112 and a plurality of extensions 186 for engaging and retaining the wafers 118. The AGV 114 positions the cassette 112 in the wet bath 110, and the first and second holders 178, 182 rotate to engage the cassette latch 220 with the cassette 112 and the extensions 186 with the wafers 118, retaining the cassette and the wafers in the wet bath during the cleaning process.

Figure 11:
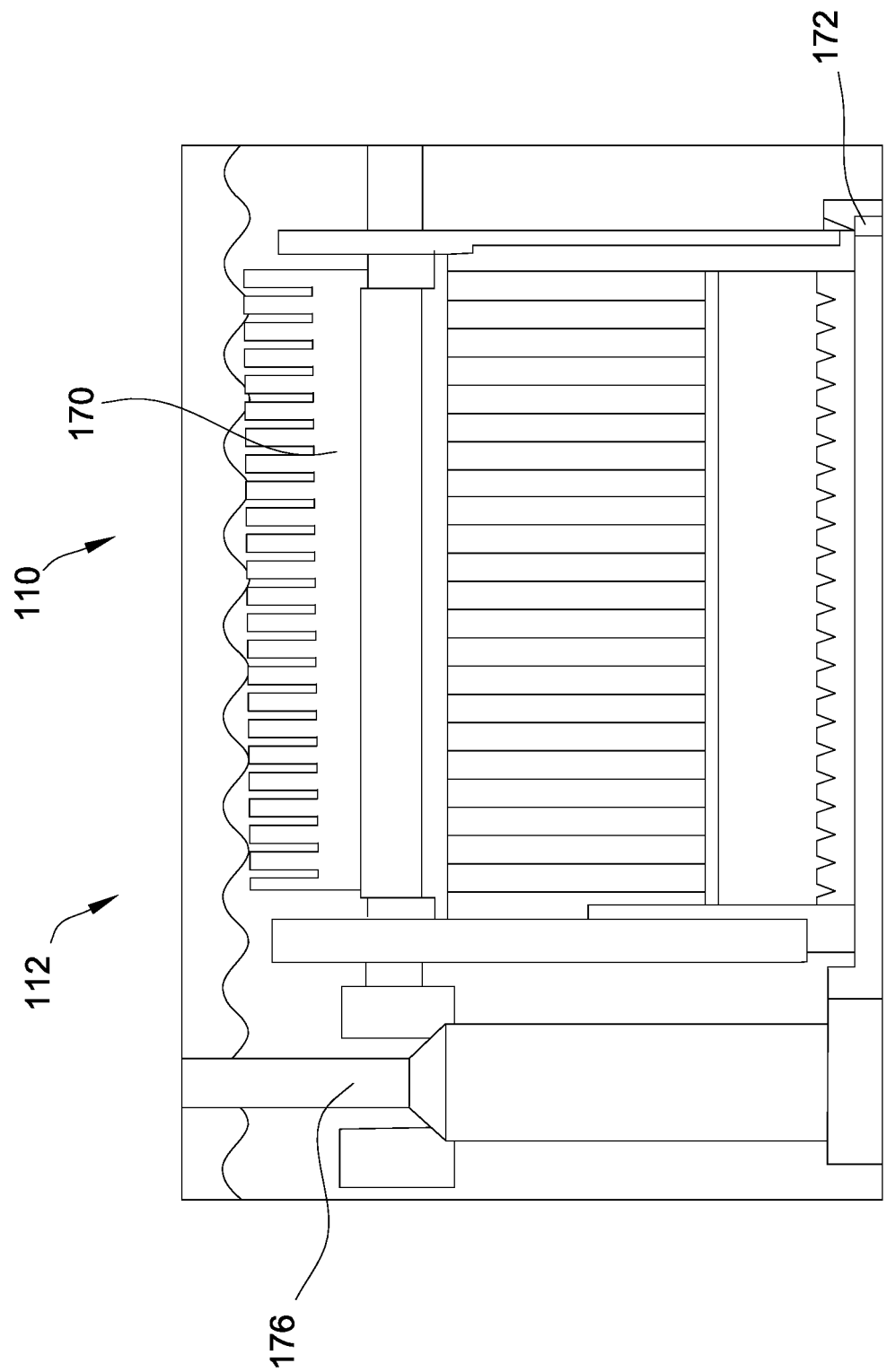
FIG. 11 is a side schematic view of the wet bath including the cassette positioned on a cassette stage guide.
Figure 12:
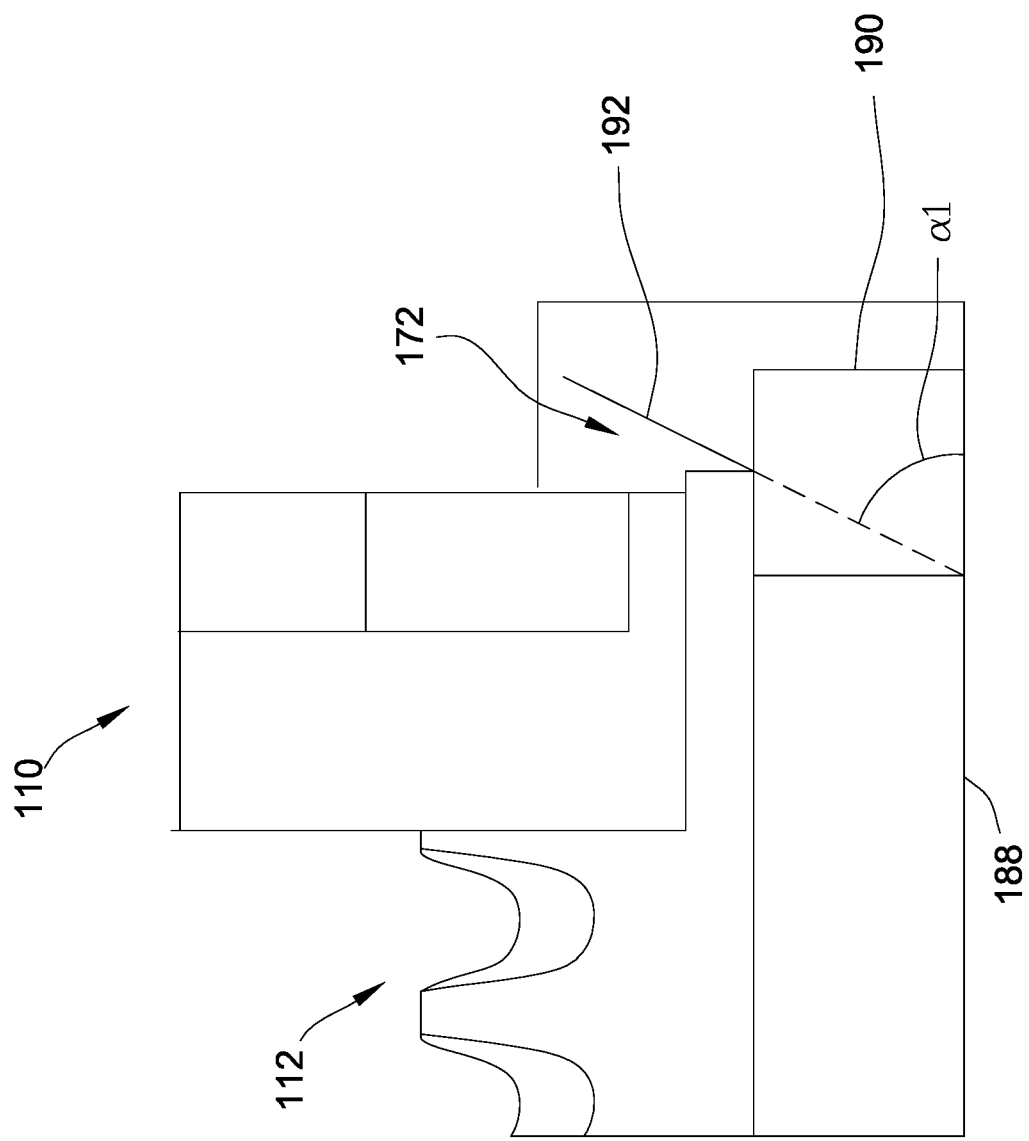
FIG. 12 is another side schematic view of the wet bath including the cassette positioned on the cassette stage guide.

As shown in FIGS. 11 and 12, the cassette stage guide 172 is positioned on a bottom wall 188 of the container 168 and guides the cassette 112 into position as the AGV 114 loads the cassette into the wet bath 110. The cassette stage guide 172 includes a guide base 190 and an angled guide 192 extending from the guide base. The guide base 190 is attached to the bottom wall 188, and the angled guide 192 is attached to, and extends from, the guide base. The angled guide 192 is oriented at a first angle α1 relative to the bottom wall 188 and guides the cassette 112 to rest on the guide base 190 as the AGV 114 positions the cassette in the wet bath 110.

Figure 13:
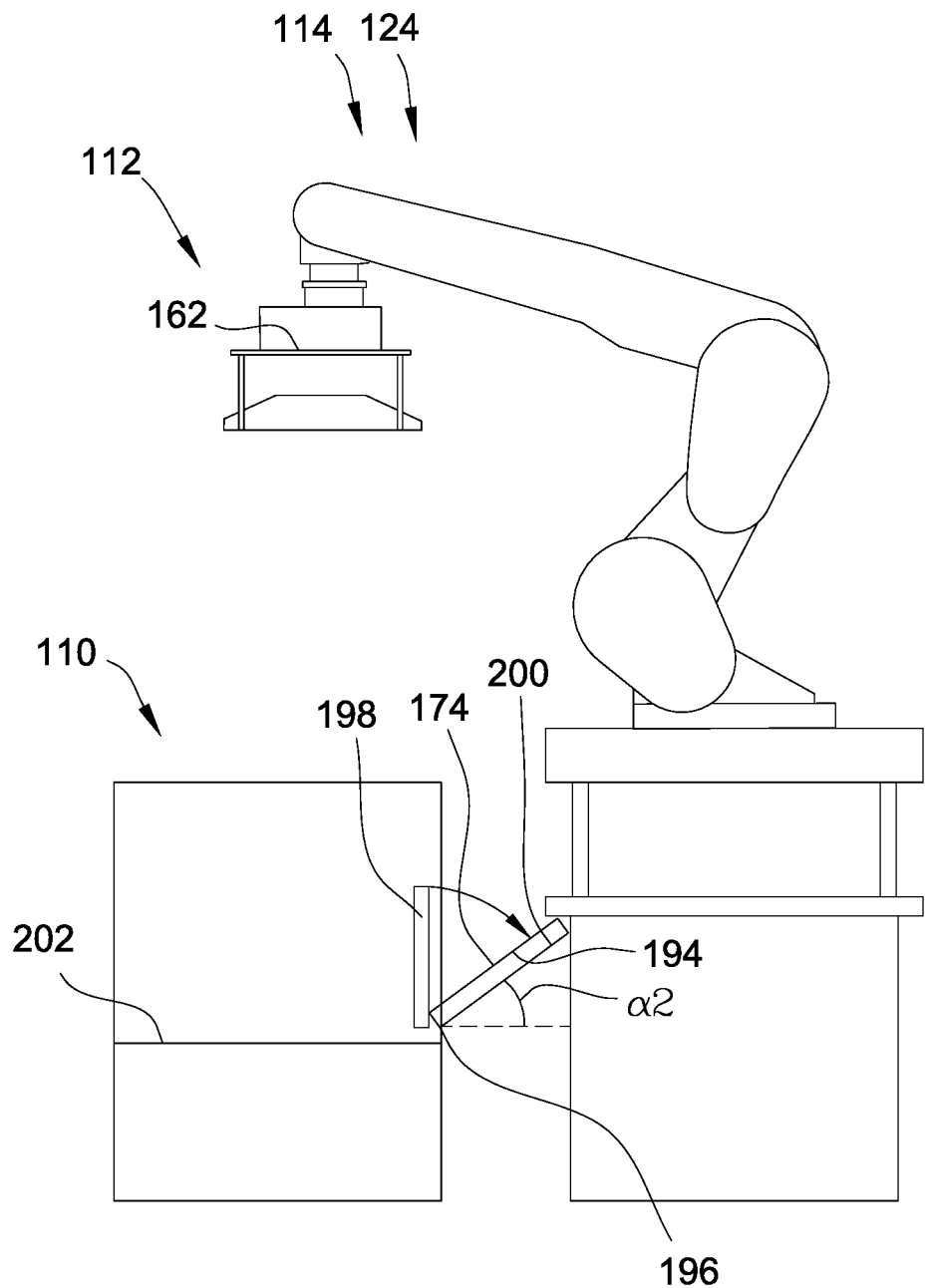
FIG. 13 is a side schematic view of an automated guided vehicle positioned next to the wet bath.

With reference to FIG. 13, the fluid trap 174 includes a platform 194 rotatably attached to at least one of the walls 166 at a trap pivot point 196. Specifically, the platform 194 is attached to the wall 166 proximate to the AGV 114 and rotates about the trap pivot point 196 to catch and retain the cleaning solution that drips off of the cassette 112 as the cassette is unloaded from the wet bath 110 by the AGV. More specifically, the platform 194 rotates from a first or stored configuration 198 to a second or deployed configuration 200 when the AGV 114 unloads the cassette 112 from the wet bath 110. The platform 194 is oriented at a second angle α2 relative to a surface 202 of the cleaning solution to channel cleaning solution back into the container 168.

As shown in FIG. 8, the AGV centering guide 176 includes a tubular guide 204 extending from the bottom wall 188 of the container 168 for guiding the cassette 112 onto the guide base 190 as the AGV 114 positions the cassette into the wet bath 110. The tubular guide 204 includes a hollow tube defining a tube opening 206 for engaging and guiding the cassette 112 into the wet bath 110. More specifically, as shown in FIG. 15, the cassette transfer attachment 162 includes at least one centering rod 208 for guiding the cassette 112 onto the guide base 190 as the AGV 114 positions the cassette into the wet bath 110. In the illustrated embodiment, the wet bath 110 includes two AGV centering guide 176 for each cassette 112, and the cassette transfer attachment 162 includes two corresponding centering rods 208. The centering rods 208 slide into the tube opening 206 as the AGV 114 lowers the cassette 112 into the wet bath 110, positioning the cassette 112 onto the guide base 190.

In this embodiment, the cleaning solution includes a non-abrasive fluid, such as deionized water, that is substantially free of silicon dioxide. More specifically, the cleaning solution includes deionized water. In alternative embodiments, the cleaning solution may include any fluid that enables the wet bath 110 to operate as described herein.

Figure 14:
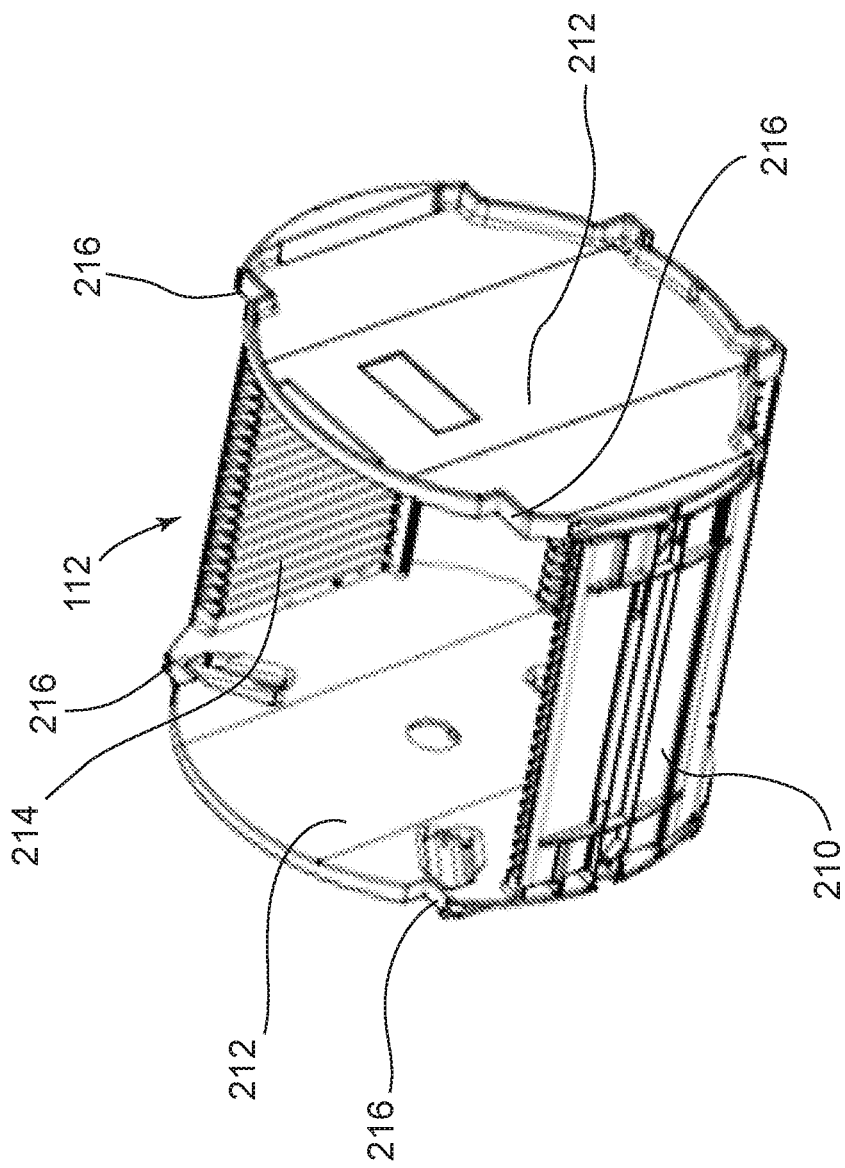
FIG. 14 is a perspective view of the cassette.

With reference to FIG. 14, the cassette 112 includes a curved base 210 and two circular ends 212. The curved base 210 includes a plurality of wafer slots 214 for retaining the wafers 118 and a plurality of engagement slots 216 for engaging with the cassette latches 220 of the first and second holders 178, 182. The transfer robot 108 positions the wafers 118 in the wafer slots 214 such that the wafers are retained in the wet bath 110. After the AGV 114 positions the cassette 112 in the wet bath 110, the first and second holders 178, 182 are rotated such that the cassette latches 220 engage the engagement slots 216 and the extensions 186 are interdigitated between the wafers 118, retaining the cassette and the wafers in the wet bath.

The controller 116 automatically controls each of the polisher 102, the unloading robot 104, the transfer robot 108, the wet bath 110 including the first and second holders 178, 182 and the fluid trap 174, and the AGV 114. Accordingly, the controller 116 automates the process of polishing the wafer 118, transferring the wafer to the wet bath 110, cleaning the wafer, and removing the cassette 112 including the wafer from the wet bath.

During operation, the wafer 118 is positioned between the first polishing assembly and the second polishing assembly 122, and the polishing assemblies are rotated to polish the wafer. The unloading robot 104 removes the wafer 118 from the polisher 102 and positions the wafer on the wafer holder 164 at the transfer location 106. Specifically, the unloading robot 104 positions the first and second arms 128 and 132 of the unloading robot such that the vacuum attachment 158 contacts the wafer 118. The vacuum attachment 158 generates a suction that maintains the wafer 118 on the vacuum attachment while the unloading robot 104 transfers the wafer to the transfer location 106. The controller 116 controls the unloading robot 104 during the transfer process such that the unloading robot transfers the wafer 118 automatically and without operator intervention.

The AGV 114 picks up the cassette 112 and positions the cassette in the wet bath 110. Specifically, the AGV 114 attaches the cassette transfer attachment 162 to the cassette 112, and the first and second arms 128 and 132 of the AGV 114 position the cassette above the wet bath 110. The AGV 114 lowers the cassette 112 into the wet bath 110 such that the centering rods 208 slide into the tube openings 206 of the tubular guides 204 of the AGV centering guides 176. The AGV centering guides 176 positions the cassette 112 in the wet bath 110 as the AGV 114 lowers the cassette into the wet bath. Additionally, the angled guide 192 of the cassette stage guide 172 also positions the cassette 112 in the wet bath 110 as the AGV 114 lowers the cassette into the wet bath. More specifically, the angled guide 192 engages the circular ends 212 of the cassette 112 to guide the cassette to the guide base 190 in the wet bath 110. Together, the AGV centering guides 176 and the cassette stage guide 172 ensure that the AGV 114 positions the cassette 112, which may include wafers 118, in the wet bath 110 with enough precision to prevent scratches or damage to the wafers or the cassette. The cassette holders 170 are rotated after the AGV 117 positions the cassette 112 in the wet bath 110 such that the extensions 186 are interdigitated between the wafers 118 and the cassette latches 220 engage the engagement slots 216. The cassette holders 170 maintain the position of the cassette 112 and the wafers 118 in the wet bath 110. The controller 116 controls the AGV 114 during the transfer process such that the AGV transfers the cassette 112 automatically and without operator intervention.

The transfer robot 108 removes the wafer 118 from the transfer location 106 and positions the wafer in the wafer slots 214 of the cassette 112. Specifically, the transfer robot 108 positions the first and second arms 128 and 132 of the transfer robot such that the wafer end effector 160 holds the wafer 118 while the transfer robot 108 transfers the wafer to the cassette 112. The controller 116 controls the transfer robot 108 during the transfer process such that the transfer robot transfers the wafer 118 automatically and without operator intervention.

The wet bath 110 cleans the wafers 118 in the cassette 112. After the wafers 118 have been cleaned, the platform 194 of the fluid trap 174 is rotated about the trap pivot point 196 from the first configuration 198 to the second configuration 200. Additionally, the cassette holders 170 are rotated such that the extensions 186 are disengaged from the wafers 118, the cassette latches 220 disengage from the engagement slots 216, and the cassette holders no longer maintain the position of the cassette 112 in the wet bath 110.

The AGV 114 picks up the cassette 112, including the wafers 118, and transfers the cassette and wafers downstream for further processing. Specifically, the AGV 114 attaches the cassette transfer attachment 162 to the cassette 112, and the first and second arms 128 and 132 of the AGV 114 are actuated to remove the cassette from the wet bath 110. The AGV 114 raises the cassette 112 out of the wet bath 110 such that the centering rods 208 slide out of the tube openings 206 of the tubular guides 204 of the AGV centering guides 176. Additionally, the angled guide 192 of the cassette stage guide 172 guides the cassette 112 out of the wet bath 110 as the AGV 114 raises the cassette. More specifically, the angled guide 192 engages the circular ends 212 of the cassette 112 to guide the cassette off of the guide base 190. Together, the AGV centering guides 176 and the cassette stage guide 172 ensure that the AGV 114 removes the cassette 112, which includes cleaned wafers 118, from the wet bath 110 with enough precision to prevent scratches or damage to the wafers or the cassette. The controller 116 controls the AGV 114 during the transfer process such that the AGV transfers the cassette 112 automatically and without operator intervention. The processing system 100 described herein automates the polishing, loading, unloading, and cleaning processes without damaging the wafers. Accordingly, the processing system 100 described herein increases the efficiency of the wafer production process and decreases the overall cost of manufacturing a wafer without damaging the wafers.

Figure 16:
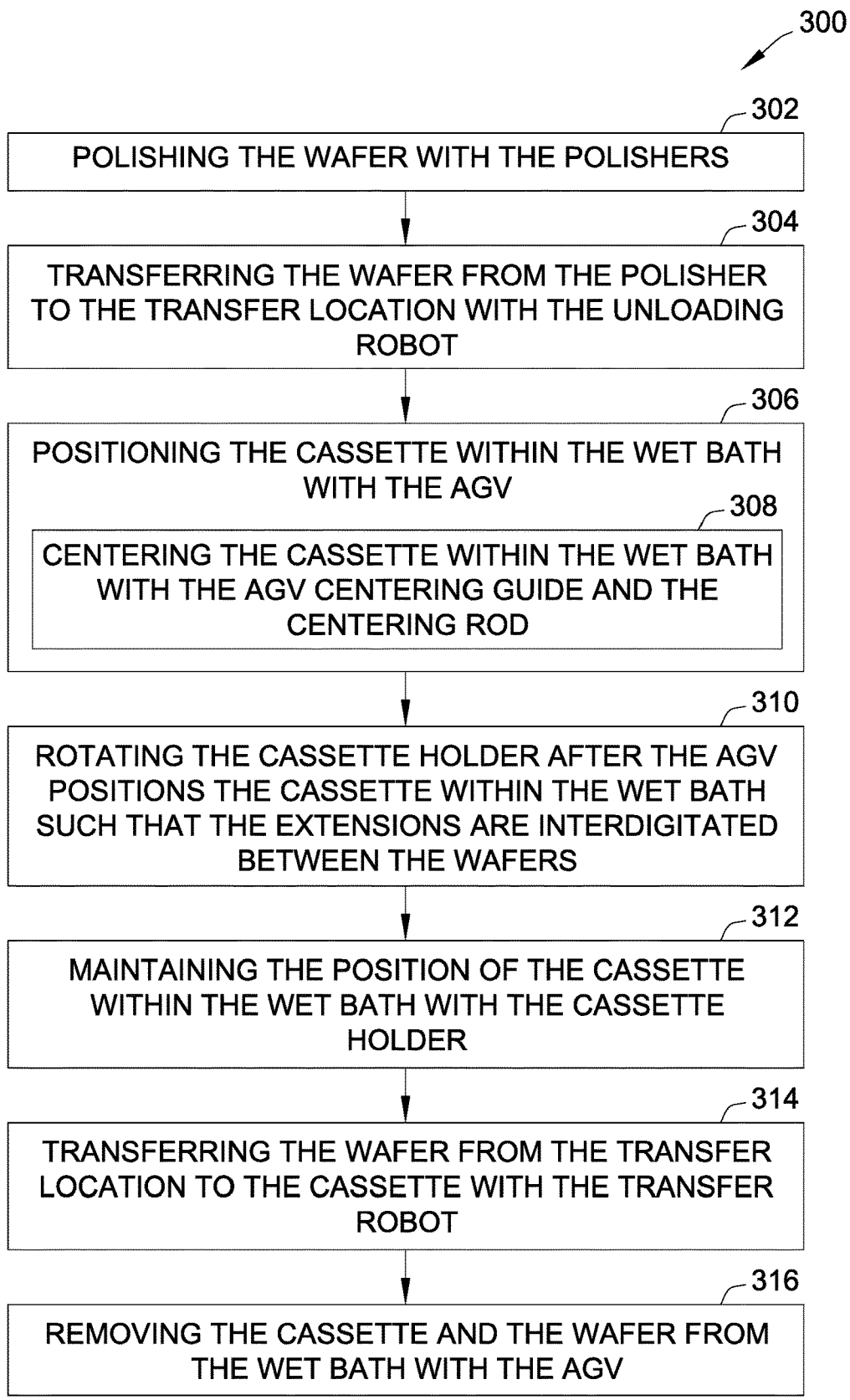
FIG. 16 is a flow diagram of a method of processing a wafer.

FIG. 16 is a method 300 of processing a wafer. The method 300 includes polishing 302 the wafer with the polisher. The method 300 also includes transferring 304 the wafer from the polisher to the transfer location with the unloading robot. The method 300 further includes positioning 306 the cassette within the wet bath with the AGV. Positioning 306 the cassette within the wet bath with the AGV may include centering 308 the cassette within the wet bath with the AGV centering guide and the centering rod. The method 300 also includes rotating 310 the cassette holder after the AGV positions the cassette within the wet bath such that the extensions are interdigitated between the wafers. The method 300 further includes maintaining 312 the position of the cassette within the wet bath with the cassette holder. The method 300 also includes transferring 314 the wafer from the transfer location to the cassette with the transfer robot. The method 300 further includes removing 316 the cassette and the wafer from the wet bath with the AGV.

Generally as disclosed herein, a semiconductor wafer processing system for processing a set of semiconductor wafers automatically loads each wafer into a wet bath for cleaning the wafers after the wafer have been polished. In an example, the system includes a polisher for polishing the wafers, an unloading robot for unloading the wafers from the polisher, a transfer robot for transferring the wafers into the wet bath, a cassette positioned in the wet bath for holding and transporting the wafers, and an automated guided vehicle (AGV) for positioning the cassette in the wet bath and removing the cassette from the wet bath. The system automatically polishes the wafers, automatically loads the wafers into the cassette and the wet bath for cleaning, and automatically unloads the cassette, including the wafers, for downstream processing. The unloading robot, transfer robot, and AGV automatically transport the wafers through the polishing and cleaning processes, automating the polishing and cleaning processes. The wet bath includes an AGV centering guide and a cassette stage guide to guide the cassette into and out of the wet bath with enough precision to prevent scratching or otherwise damaging the wafers during the transfer process. Automating the loading, unloading, and cleaning processes increases the efficiency of the wafer production process and decreases the overall cost of manufacturing a wafer without damaging the wafers.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A semiconductor wafer processing system for processing a set of semiconductor wafers, the system comprising:
   a controller;
   a transfer robot controlled by the controller;
   a wet bath for containing a cleaning solution;
   a cassette positioned in the wet bath for holding the set of wafers, wherein the transfer robot transfers a wafer from the set of semiconductor wafers from a transfer location to the cassette and the controller controls the transfer robot during the transfer;
   an automated guided vehicle (AGV) including a robot arm and a centering rod attached to the robot arm; and
   an AGV centering guide positioned in the wet bath, the AGV centering guide including a tube defining an opening, wherein the centering rod slides into the opening of the AGV centering guide for positioning the cassette in the wet bath and removing the cassette from the wet bath.

2. The wafer processing system of claim 1, wherein the transfer robot includes a 6-axis robot and a wafer end effector attached to the 6-axis robot for holding the wafer during the transfer between the transfer location and the wet bath.

3. The wafer processing system of claim 1, further comprising an unloading robot for transferring the wafer from a polisher to the transfer location.

4. The wafer processing system of claim 3, wherein the unloading robot includes a 6-axis robot.

5. The wafer processing system of claim 3, wherein the unloading robot includes a vacuum attachment for holding the wafer during the transfer between the polisher and the transfer location.

6. The wafer processing system of claim 3, wherein the polisher includes a double sided polisher, and the set of semiconductor wafers includes at least 5 semiconductor wafers.

7. The wafer processing system of claim 1, wherein the AGV includes a cassette transfer attachment attached to the robot arm for attaching the AGV to the cassette, the cassette transfer attachment including the centering rod.

8. The wafer processing system of claim 7, wherein the cassette transfer attachment includes a cassette clip for attaching to the cassette transfer attachment to the cassette.

9. A wafer processing system for processing wafers, the system comprising:
   a transfer robot;
   a wet bath including a wall and defining a container for retaining a cleaning solution;
   a cassette positioned within the wet bath for holding the wafers, wherein the transfer robot transfers the wafers from a transfer location to the cassette;

an automated guided vehicle (AGV) including a robot arm for positioning the cassette in the wet bath and removing the cassette from the wet bath; and a cassette holder attached to the wall for maintaining a position of the cassette within the wet bath, wherein the AGV positions the cassette within the cassette holder and removes the cassette from the cassette holder, the cassette holder including extensions for engaging the wafers, wherein the cassette holder is rotated after the AGV positions the cassette within the wet bath, the extensions interdigitating between the wafers.

10. The wafer processing system of claim 9 further comprising a cassette stage guide for guiding the cassette into position when the AGV positions the cassette within the wet bath.

11. The wafer processing system of claim 9 further comprising a fluid trap for retaining the cleaning solution within the wet bath when the AGV removes the cassette from the wet bath, wherein the fluid trap is movable between a stored configuration and an extended configuration.

12. The wafer processing system of claim 9 further comprising an AGV centering guide extending from a bottom of the wet bath, wherein the AGV centering guide includes a tube defining an opening.

13. The wafer processing system of claim 12, wherein the AGV includes a cassette transfer attachment including a centering rod, wherein the centering rod slides into the opening of the AGV centering guide to position the cassette within the wet bath when the AGV positions the cassette within the wet bath.

14. The wafer processing system of claim 9 in combination with the wafers, wherein the extensions engage the wafers when the cassette holder is rotated.

* * * * *